(12) United States Patent
Panella et al.

(10) Patent No.: US 11,184,991 B2
(45) Date of Patent: Nov. 23, 2021

(54) BREAK OUT MODULE SYSTEM

(71) Applicant: Molex, LLC, Lisle, IL (US)

(72) Inventors: Augusto Panella, Naperville, IL (US); Daniel B. McGowan, Glen Ellyn, IL (US); Raymond Matyka, Plainfield, IL (US); Gregory B. Walz, Maumelle, AR (US); Kirk B. Peloza, Naperville, IL (US)

(73) Assignee: Molex, LLC, Lisle, IL (US)

( * ) Notice: Subject to any disclaimer, the term of this patent is extended or adjusted under 35 U.S.C. 154(b) by 32 days.

(21) Appl. No.: 16/485,812

(22) PCT Filed: Feb. 14, 2018

(86) PCT No.: PCT/US2018/018125
§ 371 (c)(1),
(2) Date: Aug. 14, 2019

(87) PCT Pub. No.: WO2018/152166
PCT Pub. Date: Aug. 23, 2018

(65) Prior Publication Data
US 2020/0053904 A1 Feb. 13, 2020

Related U.S. Application Data

(60) Provisional application No. 62/458,887, filed on Feb. 14, 2017.

(51) Int. Cl.
*H05K 7/14* (2006.01)
*G06F 1/20* (2006.01)
(Continued)

(52) U.S. Cl.
CPC ............. *H05K 7/1498* (2013.01); *G06F 1/20* (2013.01); *H01L 23/467* (2013.01);
(Continued)

(58) Field of Classification Search
CPC .. H05K 7/1492; H05K 7/1455; H05K 7/2079; H05K 7/1498; H05K 7/20836;
(Continued)

(56) References Cited

U.S. PATENT DOCUMENTS

| 5,912,800 A | 6/1999 | Sammakia et al. |
| 7,791,890 B2 * | 9/2010 | Ishida .................. H05K 7/1492 361/727 |

(Continued)

FOREIGN PATENT DOCUMENTS

| CN | 1798101 A | 7/2006 |
| CN | 102546813 A | 7/2012 |

(Continued)

OTHER PUBLICATIONS

International Search Report and Written Opinion received for PCT application No. PCT/US2018/018125, dated Jun. 18, 2018, 11 pages.

(Continued)

*Primary Examiner* — Adam B Dravininkas

(57) ABSTRACT

A server rack with a plurality of compute nodes is positioned in a facility that includes a spine and the server rack includes a middle of rack (MOR) switch located near the middle of the server rack, vertically speaking. The MOR switch includes a plurality of ports that are connected via passive cables to the compute nodes provided in the server rack. In an embodiment the passive cables are configured to function at 56. Gbps using non-return to zero (NRZ) encoding and each cable may be about or less than 1.5 meters long. An electrical to optical panel (EOP) can be positioned adjacent a top of the server rack and the EOP includes connections to the MOR switch and to the spine, thus the EOP helps connect the MOR switch to the spine.

7 Claims, 24 Drawing Sheets

(51) Int. Cl.
*H01L 23/467* (2006.01)
*H05K 7/20* (2006.01)

(52) U.S. Cl.
CPC ....... *H05K 7/1492* (2013.01); *H05K 7/20572* (2013.01); *H05K 7/20754* (2013.01)

(58) Field of Classification Search
CPC ........... H05K 7/20572; H05K 7/20754; H05K 7/1491; G06F 13/409; G06F 11/0751; G06F 11/2289; G06F 11/3041; G06F 11/3048; G06F 11/3051; G06F 13/102; G06F 19/00; G06F 1/20; H01L 23/467
See application file for complete search history.

(56) References Cited

U.S. PATENT DOCUMENTS

| | | | |
|---|---|---|---|
| 9,838,138 B1* | 12/2017 | Arabaci | H04B 10/614 |
| 2008/0186667 A1* | 8/2008 | Verdiell | H05K 7/1492 |
| | | | 361/679.4 |
| 2009/0168330 A1 | 7/2009 | Li et al. | |
| 2010/0254652 A1* | 10/2010 | Kirkpatrick | H04Q 11/0005 |
| | | | 385/17 |
| 2012/0008945 A1* | 1/2012 | Singla | H04J 14/0212 |
| | | | 398/49 |
| 2012/0039032 A1* | 2/2012 | Archibald | H05K 7/1492 |
| | | | 361/679.02 |
| 2013/0287397 A1* | 10/2013 | Frankel | H04J 14/0213 |
| | | | 398/50 |
| 2014/0085801 A1* | 3/2014 | Ning | G06F 1/20 |
| | | | 361/679.31 |
| 2015/0009702 A1 | 1/2015 | Fiederling et al. | |
| 2015/0039788 A1* | 2/2015 | Dearing | G06F 13/20 |
| | | | 710/18 |
| 2015/0098683 A1* | 4/2015 | Gross | G02B 6/4455 |
| | | | 385/135 |
| 2015/0178172 A1* | 6/2015 | Brodsky | G06F 11/3048 |
| | | | 710/16 |
| 2015/0222236 A1* | 8/2015 | Takemoto | H03F 3/08 |
| | | | 250/214 A |
| 2015/0249501 A1* | 9/2015 | Nagarajan | H04B 10/40 |
| | | | 398/79 |
| 2016/0192515 A1 | 6/2016 | Chen et al. | |
| 2016/0335209 A1* | 11/2016 | Jau | G06F 13/36 |
| 2016/0337041 A1* | 11/2016 | Wen | G02F 1/21 |
| 2017/0099190 A1* | 4/2017 | Pitwon | H04L 49/00 |

FOREIGN PATENT DOCUMENTS

| | | |
|---|---|---|
| JP | 2007128498 A | 5/2007 |
| JP | 2008251067 A | 10/2008 |
| JP | 2012227861 A | 11/2012 |
| JP | 2014170991 A | 9/2014 |
| JP | 2016096225 A | 5/2016 |
| JP | 2016127549 A | 7/2016 |
| TW | M401282 U | 4/2011 |
| TW | 201534198 A | 9/2015 |
| WO | 2015/051023 A1 | 4/2015 |
| WO | 2018/152166 A1 | 8/2018 |

OTHER PUBLICATIONS

Notice of Reasons for Refusal received for JP application No. 2019-564382, dated Dec. 1, 2020, 6 pages. (3 pages of English translation and 3 pages of Official copy).

* cited by examiner

BREAK OUT MODULE SYSTEM

RELATED APPLICATIONS

This application is a national stage of International Application No. PCT/US2018/018125, filed Feb. 14, 2018, which claims priority to United States Provisional Serial Application No. 62/458,887, filed Feb. 14, 2017.

TECHNICAL FIELD

This disclosure relates to the field of server architecture, more specifically to configuration of racks of servers in a server room.

DESCRIPTION OF RELATED ART

In one typical computing configuration there is a client and a server. In general the client and server can be positioned close together so that they are in the same box or spaced apart so that the client is provided in one box and the server is positioned in another box that is positioned some distance away (often in another room or in a different building and sometimes in a different city or country or continent). Having the client and server positioned close together allows for low latency between the client and server but makes it difficult for the server to be shared between multiple clients, often resulting in under-utilization of the server. In addition, if the server is performing intensive computations then more power is needed locally (which is obviously a problem for mobile devices). Thus, for the sake of efficiency and cost, placing the server in a server farms has become increasingly popular.

To support this general trend of increased offering of services over a network, as well as to support the large number of mobile devices that rely on served computing services, the use of servers has grown substantially. The dramatic increase in the number of servers has led to a situation where larger computing service providers design and maintain large facilities filled with servers. These facilities are sometimes known as server farms and may contain hundreds or thousands of square meters of servers.

As can be appreciated, managing such a facility is a challenging task. Having such a large facility necessitates the use of some logical organization so that the servers can be properly provisioned, maintained and replaced. In addition to the mechanical logistics, computation logistics also must be considered. Various clients are providing input to a server, a server will perform some amount of computational work (e.g., a task) and then the server will provide a response to the client. Architecturally speaking, in order to manage the resources efficiently the bandwidth for receiving inputs, performing necessary calculations and providing output must be configured so that the overall workload is balanced.

FIGS. 1A and 1B illustrate one common such configuration. Racks of servers are positioned in the facility. At the top of each rack is a switch, commonly referred to as a top of the rack switch or TOR switch. The TOR switch is connected to some input point (sometimes referred to as the spine) that can be 100 meters or more away via an active optical connection. The TOR switch is also connected to compute nodes (that can act as a server) via passive copper cables.

One common configuration is to use QSFP style receptacles in the TOR switch. For example, QSFP receptacles are configured to communicate between the TOR switch and the spine and between the TOR switch and the compute notes. For the QSFP receptacles going from the TOR switch to the spine, the QSFP receptacles receive active optical modules that convert the electrical signals into optical signals and then transmit those signals over optical fibers. Due to the much shorter distance between the TOR switch and the compute nodes, cheaper passive copper cables can be used between the TOW switch and the compute nodes. Each QSFP connector has 4 bidirectional channels and therefore sometimes the QSFP plug connector to be split out into four SFP style connectors (which each have 1 bidirectional channel). Thus, for a 32 port switch, 8 ports will be directed toward the spine while 24 are directed toward the compute nodes. As can be appreciated, such a switch will result in a 3:1 oversubscription of the connection between the switch and the spine. Specifically, the bandwidth between the switch and the compute nodes is three times the bandwidth between the switch and the spine. In practice such a ratio tends to result in reasonably balanced utilization of the communication channels while still effectively supporting the compute nodes and thus has been widely adopted.

Issues exist, however, with the current configuration. One issue is that as the data rates increase from 28 Gbps to 56 Gbps (using NRZ encoding) and 112 Gbps (using PAM4 encoding) the current TOR switch has issues with supporting the current configuration. Specifically, the passive cable assemblies from the TOR switch to the compute nodes at the bottom of the rack become difficult to support without the use of forward error correction (FEC) as the length of the longest cables is expected to be about 2.5 meters. The use of FEC results in substantial additional energy, thus substantially increasing the energy consumption in a large server farm. In addition, the current QSFP connections are likely insufficient to support higher speed passive cable links. As a result, certain individuals would appreciate an improved server rack configuration.

SUMMARY

A server rack system to provide a plurality of compute nodes includes a rack of boxes, each box supporting one or more compute nodes. The compute nodes (which may be processors) are connected to middle of the rack (MOR) switch that allows for reduce cable lengths between the MOR switch and the compute nodes. The MOR switch can be directly connected to optical cables or can be connected to an electrical to optical panel (EOP) that allows for conversion of the electrical signals to optical signals. The EOP communicates with a spine and in some embodiments may communicate with other EOPs. The use of the MOR switch in combination with the EOP allows for improved thermal management and also allows for additional flexibility in communication paths between adjacent servers and the spine.

BRIEF DESCRIPTION OF THE DRAWINGS

The present disclosure is illustrated by way of example and not limited in the accompanying figures in which like reference numerals indicate similar elements and in which.

DETAILED DESCRIPTION

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

Figure 2A:
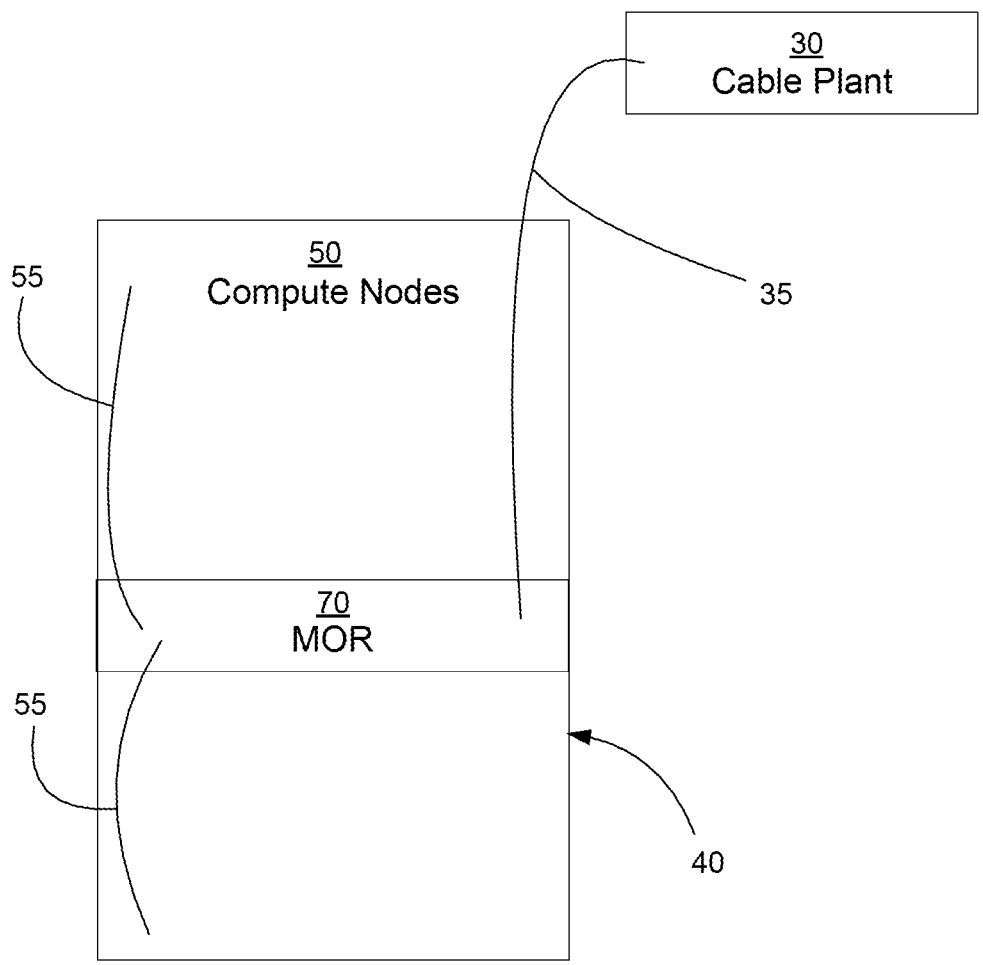
FIG. 2A illustrates a schematic representation of an embodiment of a server rack with a middle of the rack (MOR) switch.
Figure 2B:
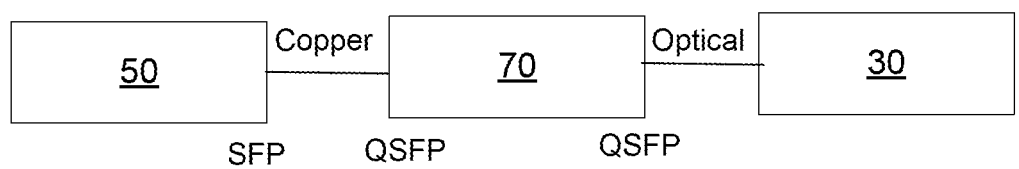
FIG. 2B illustrates another schematic representation of the server rack configuration depicted in FIG. 2A.

As can be appreciated from FIGS. 2A and 2B, an embodiment of a server rack 40 is disclosed. The server rack 40 includes a plurality of boxes (typically in 1U or 2U sizes but other sizes are also suitable) and each box provides a number of compute nodes. The compute nodes can be heterogeneous or homogenous in nature and can include various known constructions, such as but without limitation, one or more FPGAs, CPUs, controllers, ASICs, DSPs and/or GPUs. Each compute node is configured to provide some sort of computational capabilities and different compute nodes can have different capabilities depending on the intended use.

Figure 1A:
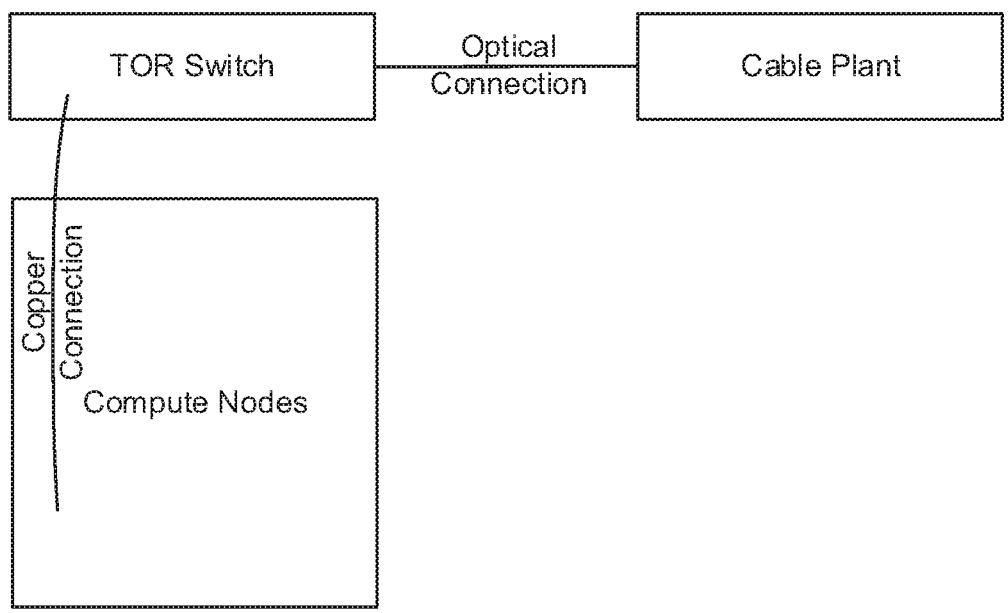
FIG. 1A illustrates a schematic representation of a prior art server rack configuration.
Figure 1B:
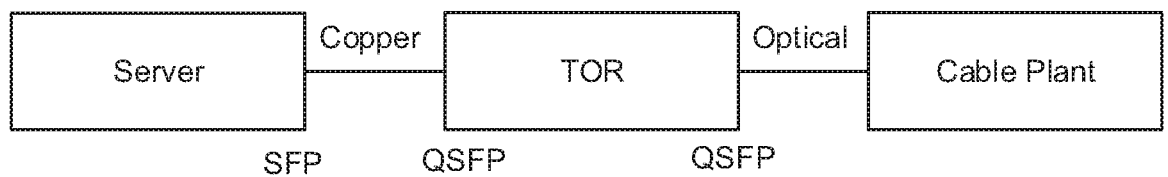
FIG. 1B illustrates another schematic representation of the prior art server rack configuration depicted in FIG. 1A.

As can be appreciated, the configuration depicted in FIG. 2A that is similar the prior art design in FIG. 1A but includes a middle of the rack (MOR) switch 70. It has been determined that with such a configuration it is possible to shorten cables 55 (which preferably will be passive copper cables) that extend between the MOR switch 70 and compute nodes 50 so that the longest length of the cables 55 is about 1.5 m. It is expected that such a maximum length will allow the server rack to function without forward error correction (FEC).

Figure 16:
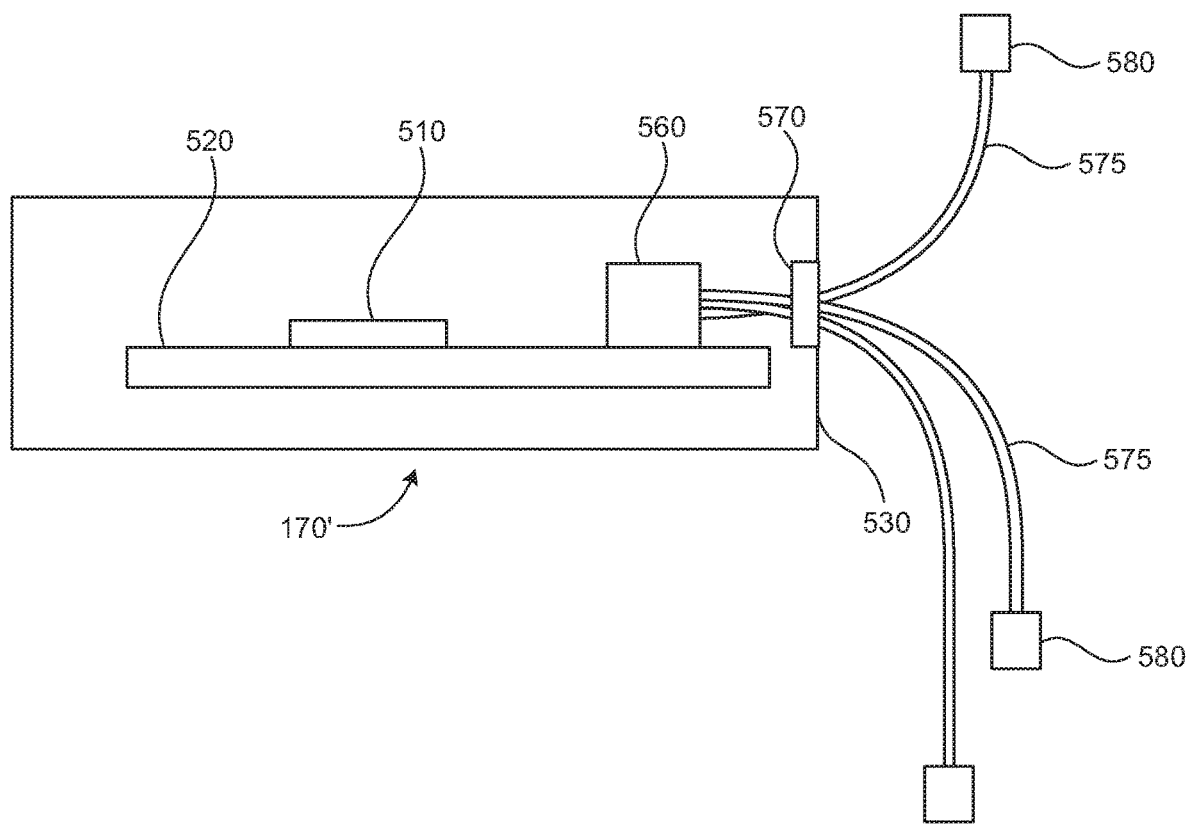
FIG. 16 illustrates a schematic representation of an embodiment of a switch with reduced insertion loss.

The MOR switch 70 is connected to the cable plant 30 (which is sometimes referred to as the spine and can have a wide range of configurations depending on how a particular facility is organized) via one or more optical cables 35 conventionally used with the TOR switch (the optical cables each include one or more optical fibers). One potential issue is that if the optical cables 35 do not include sufficient slack near the position of the TOR switch then it will be difficult to extend the optical cables 35 to the MOR switch 70 and it may be necessary to pull new optical cables. Naturally, pulling new optical cables tends to diminish the cost benefits of such a design. It is expected, however, that in certain circumstances the configuration in FIG. 2A will be feasible. Additional features, such as the elements depicted in FIG. 16 (disclosed below) can also be added into the MOR switch 70 if desired.

It should be noted that in addition to allowing for the removal of FEC, which can provide a significant power reduction for a server farm, the net effect is a reduce overall length of cables. Thus the depicted design should provide a cost reduction for the cable portion.

Figure 3A:
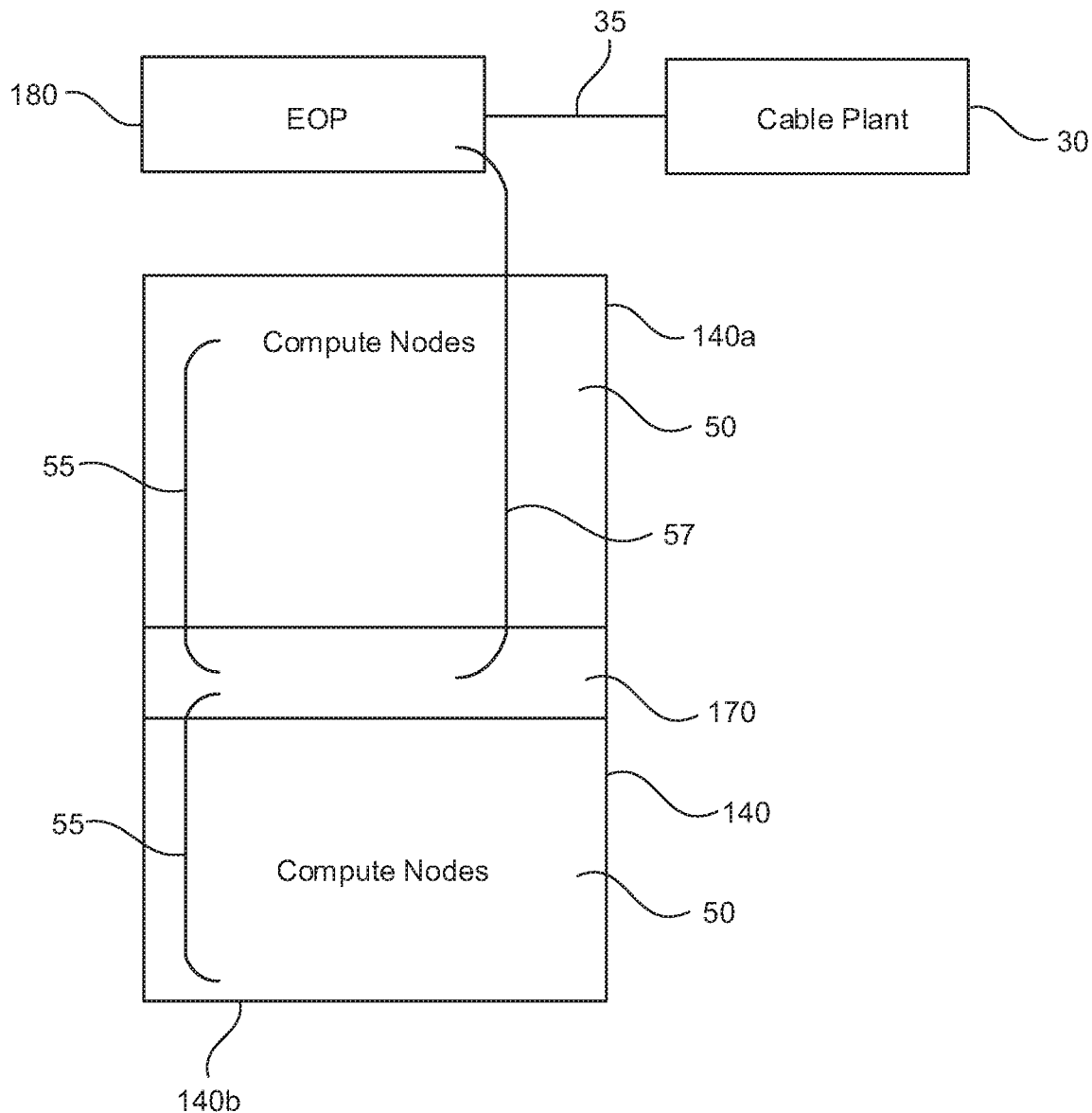
FIG. 3A illustrates a schematic representation of an embodiment of a server rack with a MOR switch and an electrical to optical panel (EOP).
Figure 3B:
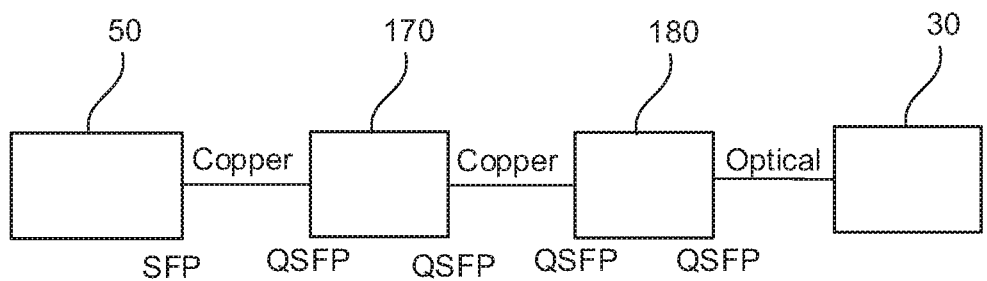
FIG. 3B illustrates another schematic representation of the server rack configuration depicted in FIG. 3A.

FIGS. 3A and 3B illustrate another embodiment of a server rack 140 with a top 140a and a bottom 140b that includes a MOR switch 170. The MOR switch 170 is located between the top 140a and the bottom 140b and preferably is located approximately halfway between the top 140a and the bottom 140b. In the depicted embodiment the MOR switch 170 does not include electrical to optical switches. Instead an electrical to optical panel (EOP) 180 is provided on top of the rack. It should be noted that while the EOP 180 is expected to be most desirably located on top of the rack, it is also contemplated to locate the EOP 180 on near the top of the rack (e.g., positioned in the server rack but adjacent the top of the rack). The MOR switch 170 connects to the compute nodes 50 with cables 55 that are shorter than 2 meters (potentially not longer than about 1.5 meters). The MOR switch 170 is connected to the EOP 180 via passive cables (which can be about 1.5 meters in length) and then the EOP is connected to the cable plant 30 via one or more optical cables 35. As can be appreciated from FIG. 3B, sometimes there are more compute nodes than ports in the MOR switch 170. To manage the issue, cables can include a 4× interface at the MOR switch 170 and a 1× interface at the compute node. Depending on the number of compute nodes and ports this ratio can change to something different than the 4:1 ratio of QSFP connectors to SFP connectors.

As can be appreciated, some of the benefits of the depicted design shown in FIG. 3A relate to energy consumption. The reduction in the length of the passive cables allows the system to support high data rates without FEC, preferably allowing support of at least 56 Gbps per directional channel and more preferably support 112 Gbps per directional channel. In addition, the use of the EOP allow for improved thermal management because the optical modules tend to generate significant amounts of thermal energy. By separating the optical modules from the MOR switch it becomes much easier to ensure all components are managed appropriately from a thermal standpoint.

Figure 4A:
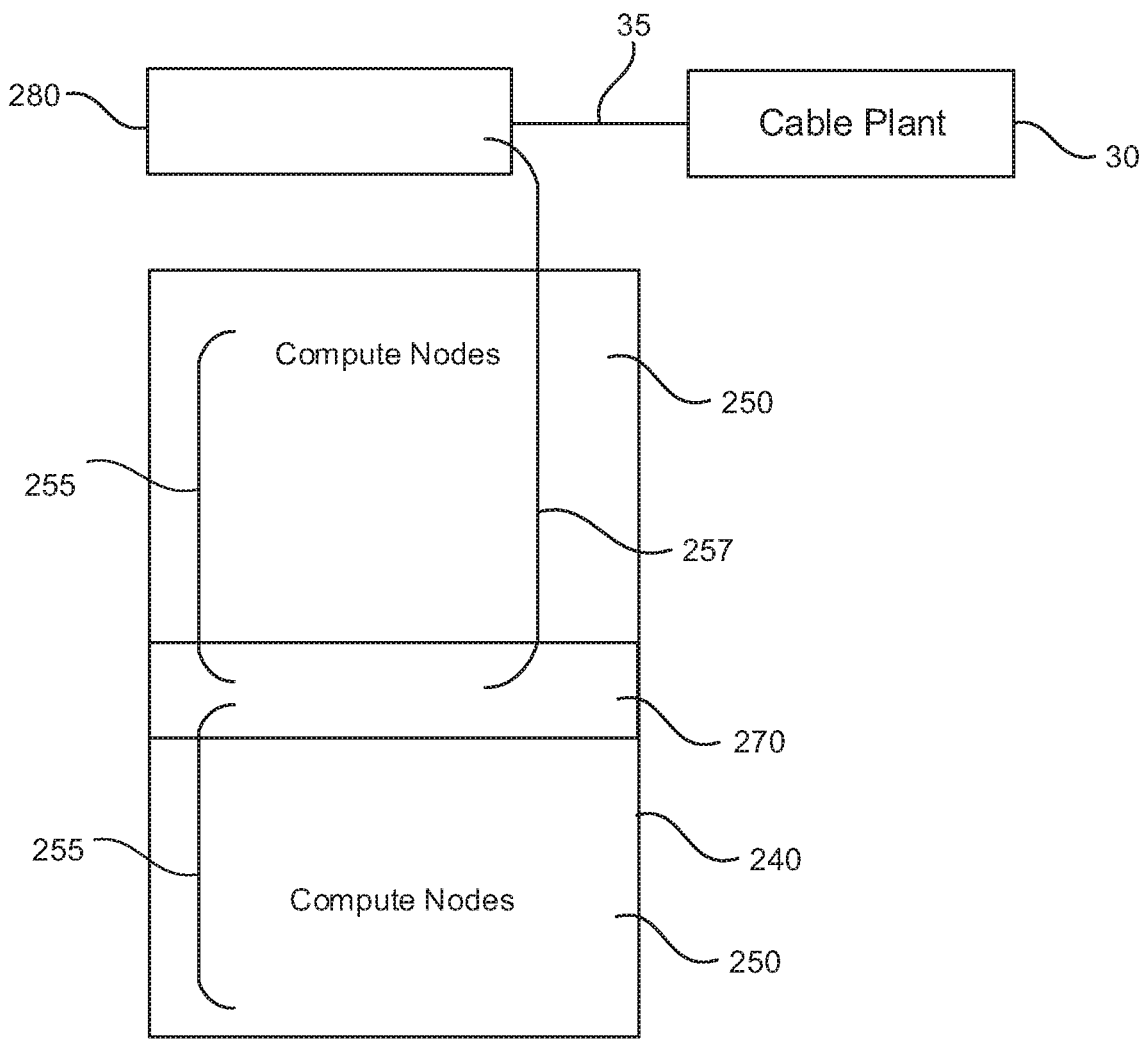
FIG. 4A illustrates a schematic representation of another embodiment of a server rack with a MOR switch and an EOP.
Figure 4B:
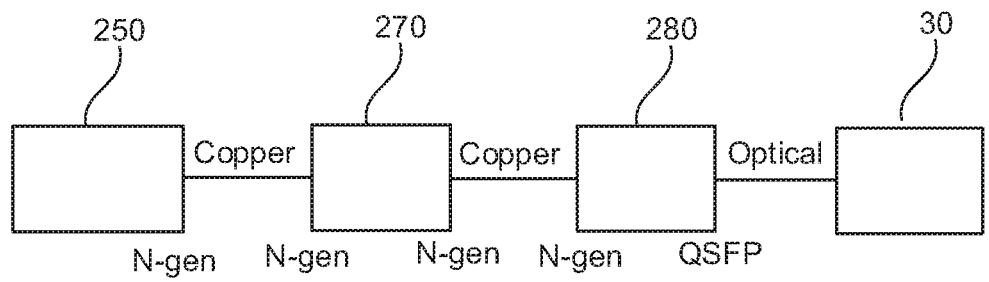
FIG. 4B illustrates another schematic representation of the server rack configuration depicted in FIG. 4A.

FIGS. 4A and 4B illustrate another embodiment with a server rack 240 that has a configuration similar to that depicted in FIGS. 3A and 3B. Similar to the embodiment depicted in FIG. 3A, the cable plant 30 is connected to a EOP 280 with an optical cable 35. The EOP 280 is in turn connected to a MOR switch 270 with a cable 257. The MOR switch 270 is then connected to compute nodes 250 with cables 255. As can appreciated, one of primary differences is that the QSFP and SFP connectors are replaced with a next-gen connector and thus cables 255 and cables 257 are used. While QSFP and SFP connectors have been used for a number of years, their basic construction is suboptimal for high data rates and therefore it is more desirable to use a next-gen connector that is better suited to supporting 56 Gbps data rates using non-return to zero (NRZ) encoding and 112 Gbps data rates using PAM4 encoding.

Figure 5:
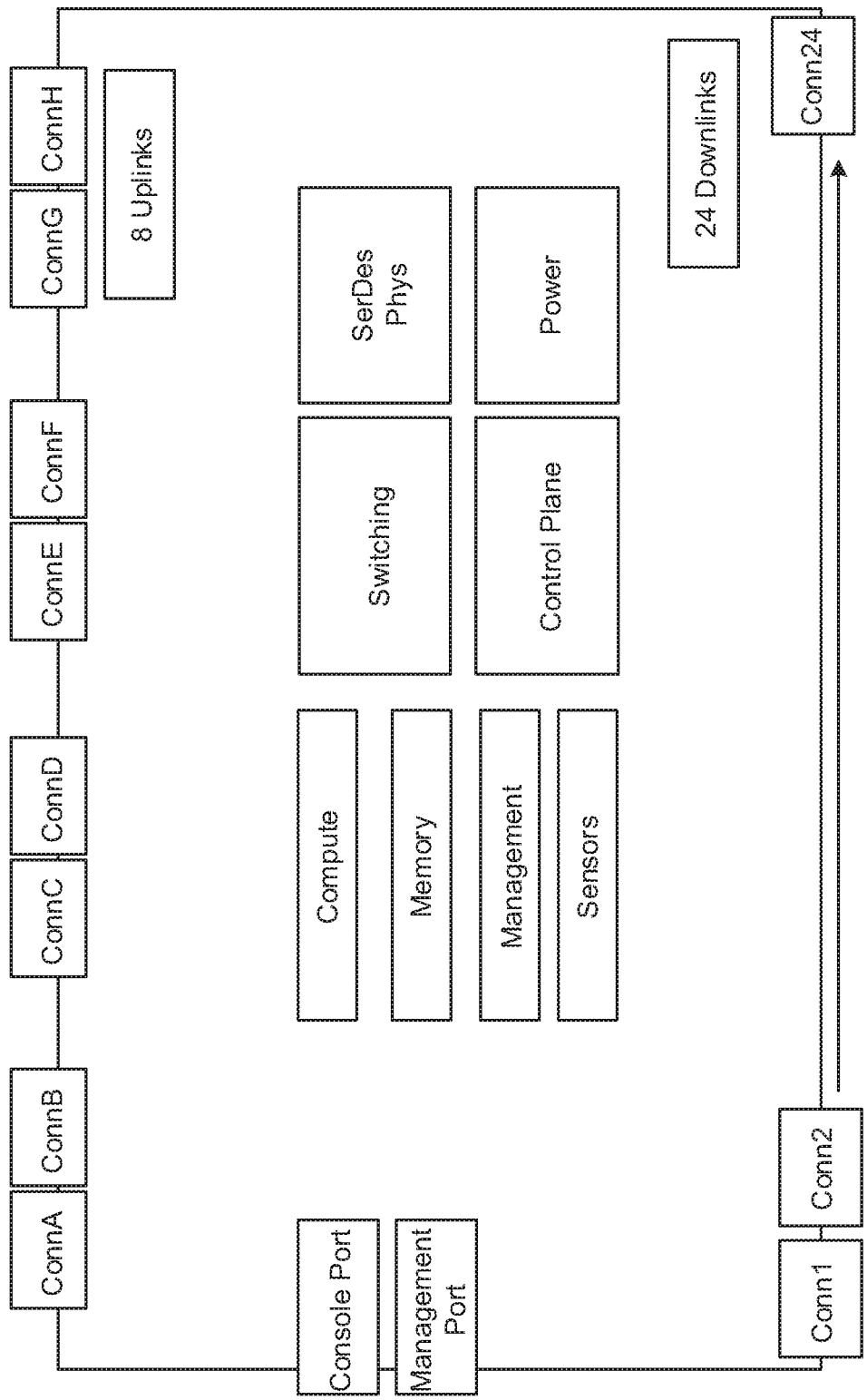
FIG. 5 illustrates a schematic representation of an embodiment of a MOR switch.

FIG. 5 illustrates a block diagram of a MOR switch, such as MOR switch 170. Typically a MOR switch is configured as a 1U box and such a configuration is contemplated but is not required in all cases. While numerous features can be added, one potential benefit of this design, as noted above, is that the electrical to optical conversion can be moved out of the MOR switch. This provides a substantial reduction in waste heat and makes cooling the MOR switch much more effective. The depicted embodiment has 8 connector ports that could lead to the EOP while including 24 connector ports that lead to the compute nodes but some other number of connections is possible, particularly if a next-gen connector is used that is more compact than the existing QSFP style connectors. However, if the MOR switch is intended to be connected directly to the spine (as shown in FIG. 2A, for example) then the uplink connectors will be configured appropriately and additional cooling will likely be required.

Figure 6:
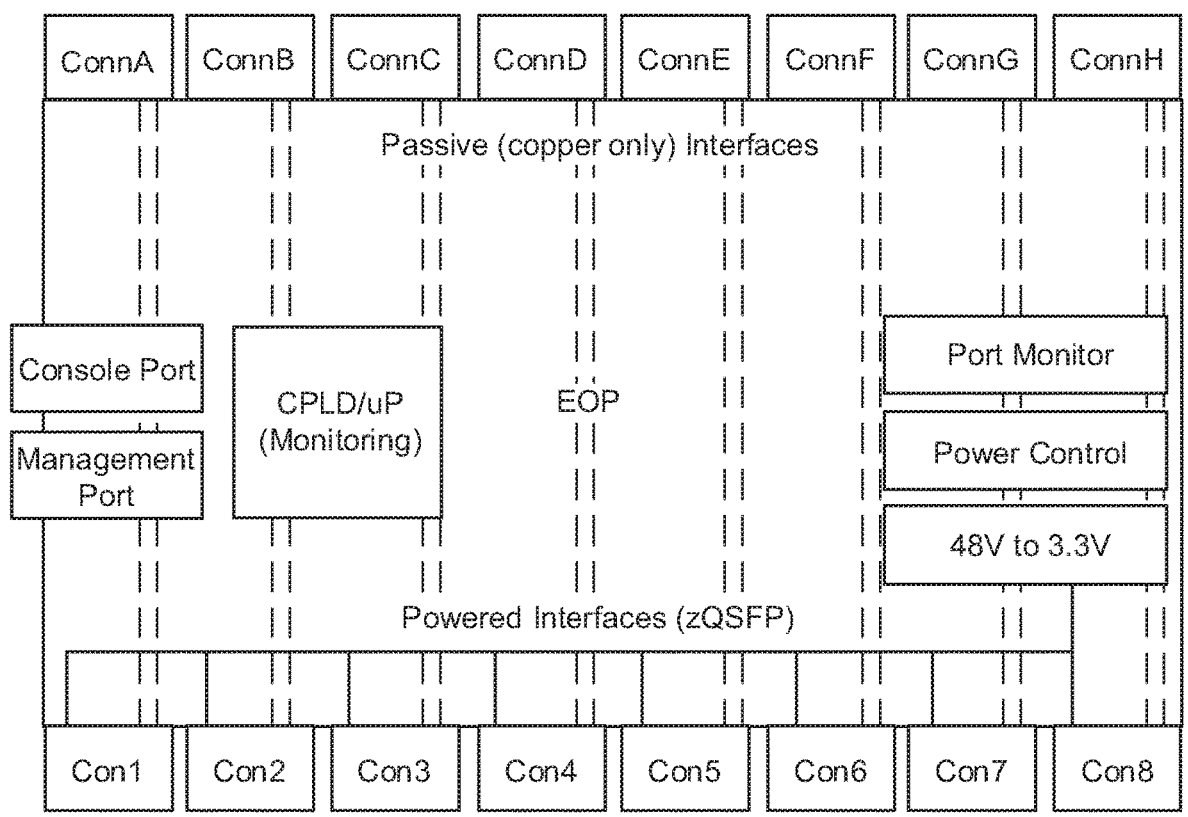
FIG. 6 illustrates a schematic representation of an embodiment of an EOP.

A schematic representation of an EOP, such as EOP 180, is depicted in FIG. 6. The EOP can be made relatively efficiently but one significant benefit is the ability to move waste thermal energy away from MOR switch. In a standard switch architecture all the ports are powered because it is unknown which ports will receive transceiver modules. With the EOP, however, the ports that can receive transceiver modules are known and thus some wasted power can be avoided by not powering the ports that don't accept transceivers. In addition, as can be appreciated, concentrated heat become difficult to cool in a rack configuration and placing the optical transceivers right next to the switch increases the thermal load in a single box. The depicted EOP can still include QSFP ports that accept the electrical to optical modules that generate waste thermal energy converting the electrical signals to optical signals suitable for longer transition lengths. By positioning them away from the MOR switch, however, it becomes easier to manage the thermal load. Naturally, moving the heat away from the MOR switch should also allow for increased reliability and improved performance of the MOR switch. It should also be noted that the EOP can directly convert the electrical signals to optical signals, obviating the need for separate electrical/optical transceiver modules. In such a situation the EOP could include standard optical fiber connectors such as the Lucent Connector/Physical Contact (LC/PC) connector that allow the EOP to be connected to the cable plant or spine instead of more traditional ports such a QSFP receptacles.

Figure 7:
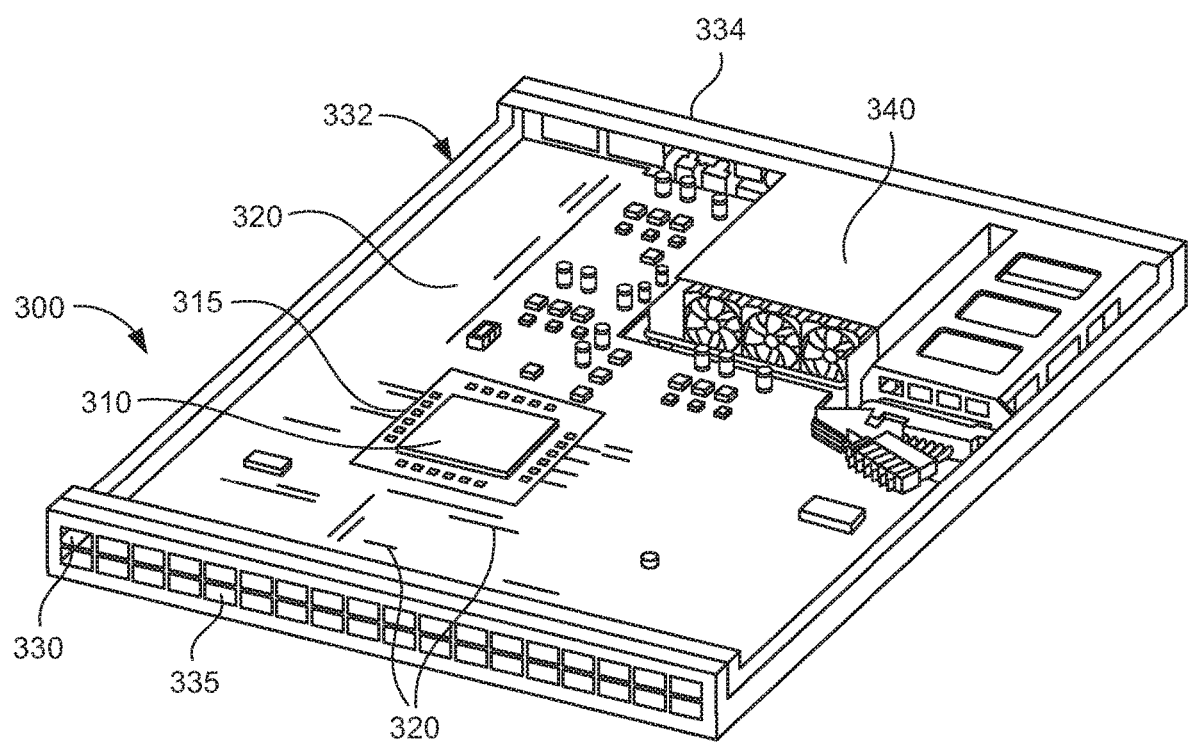
FIG. 7 illustrates features of an embodiment of a prior art switch configuration
Figure 8:
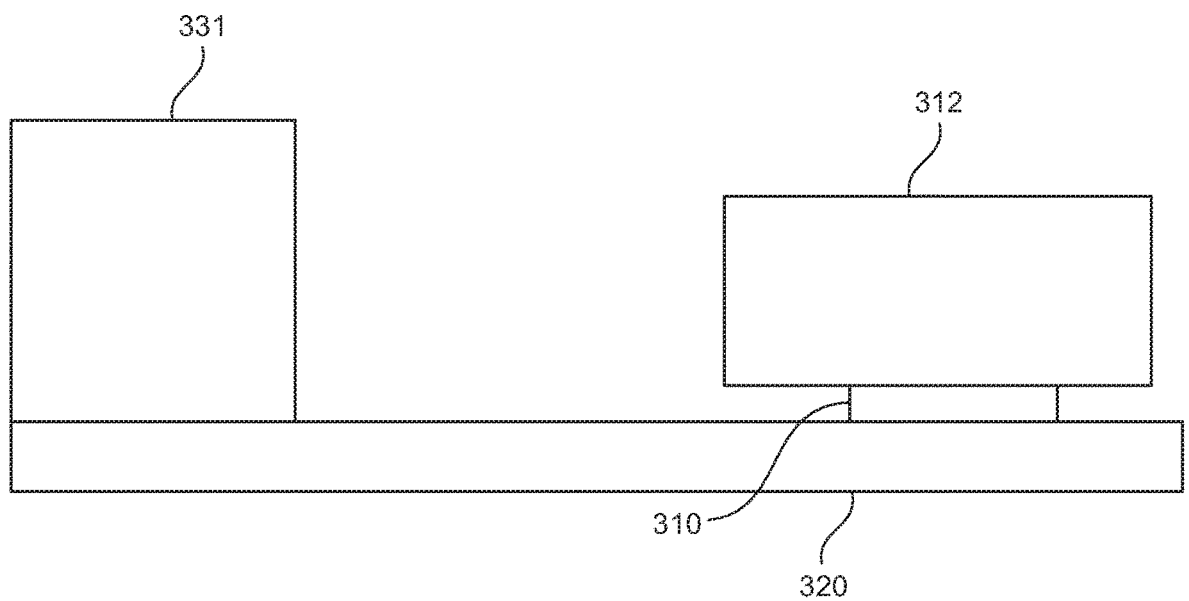
FIG. 8 illustrates features of an embodiment of a prior art switch configuration.
Figure 9:
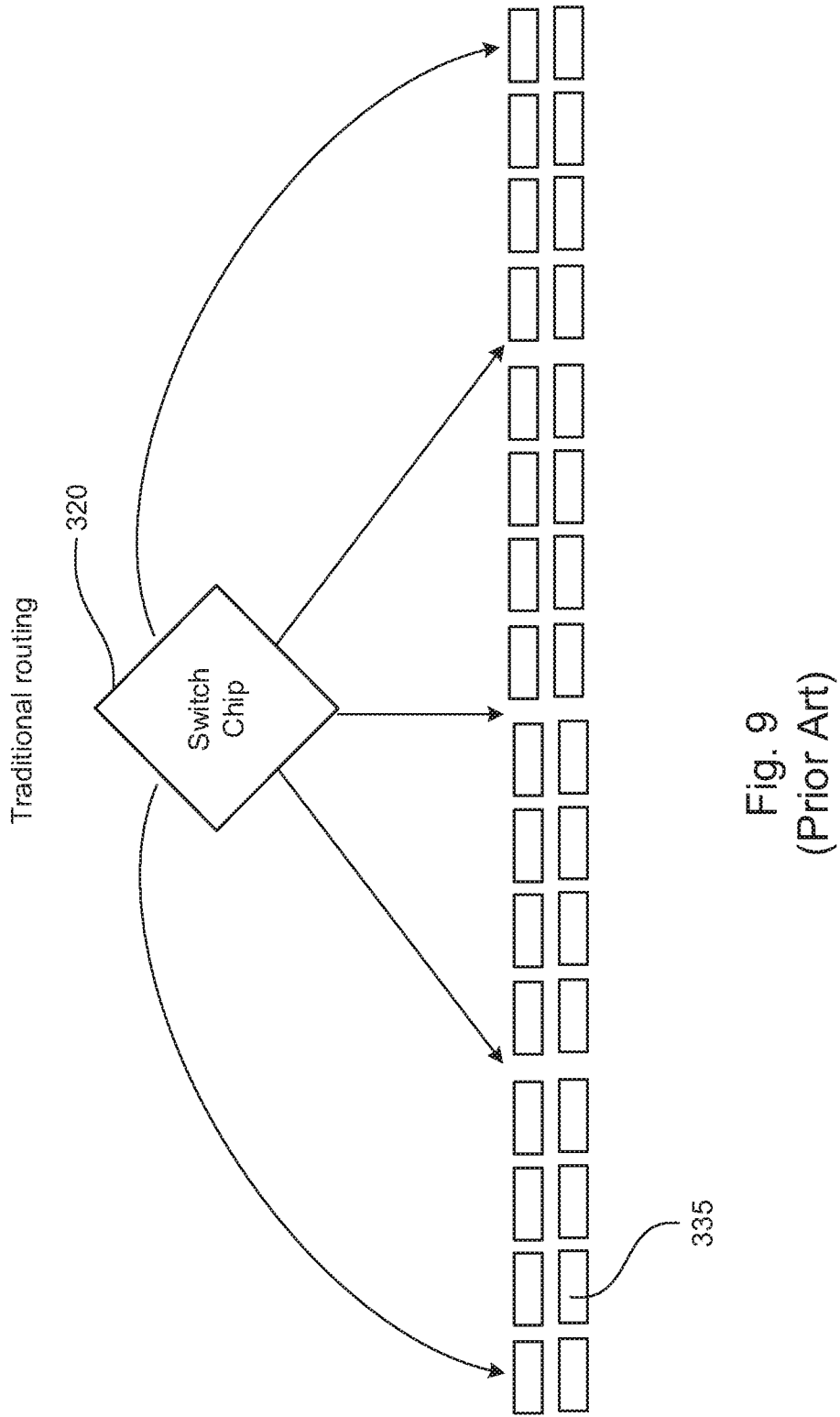
FIG. 9 illustrates features of a prior art circuit board configuration.
Figure 10:
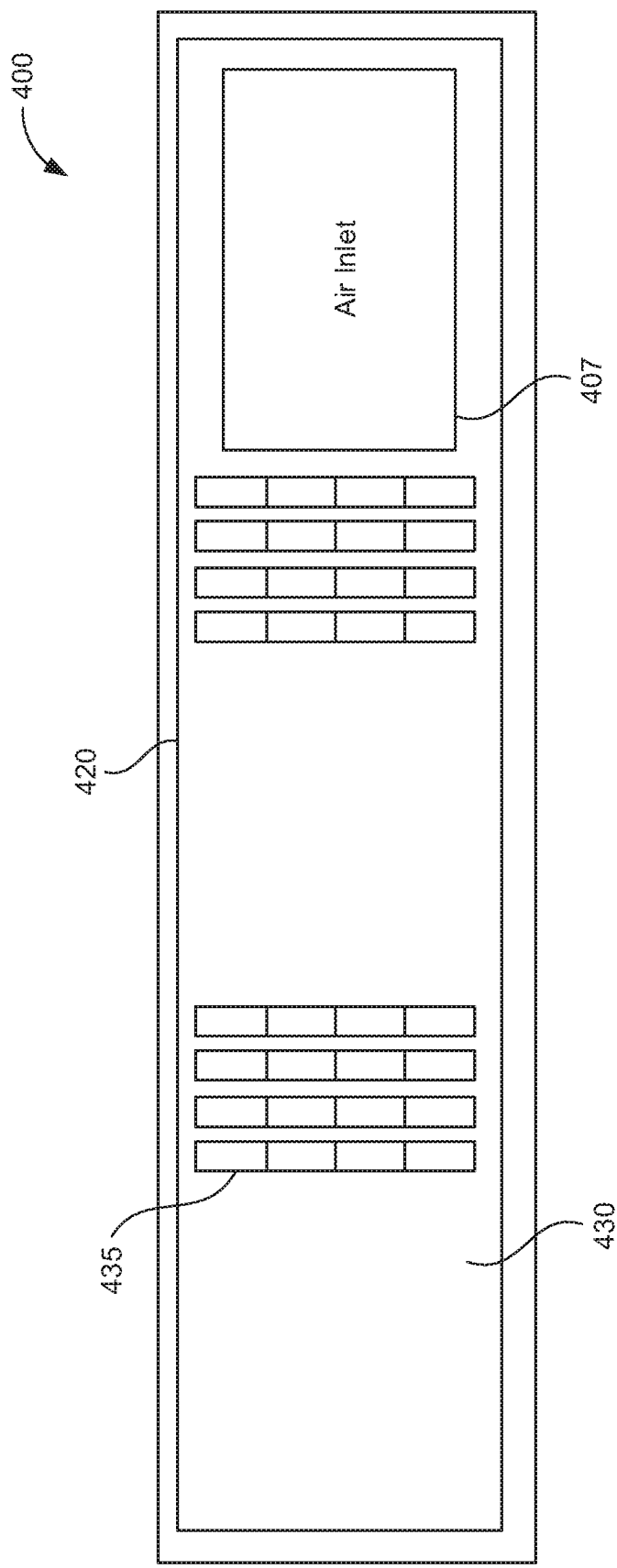
FIG. 10 illustrates a schematic representation of an embodiment of a MOR switch.
Figure 11:
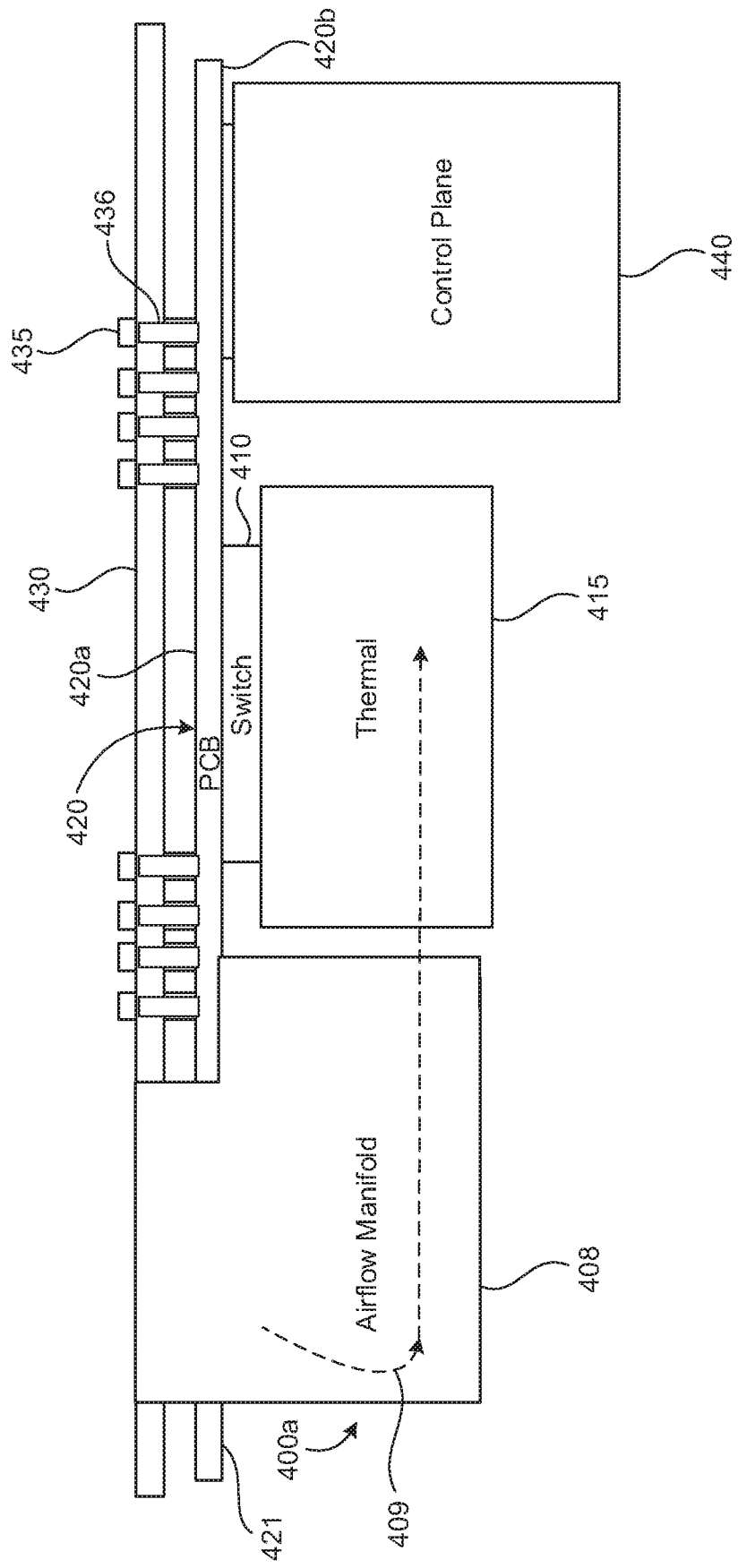
FIG. 11 illustrates another schematic representation of the embodiment depicted in FIG. 10.
Figure 12:
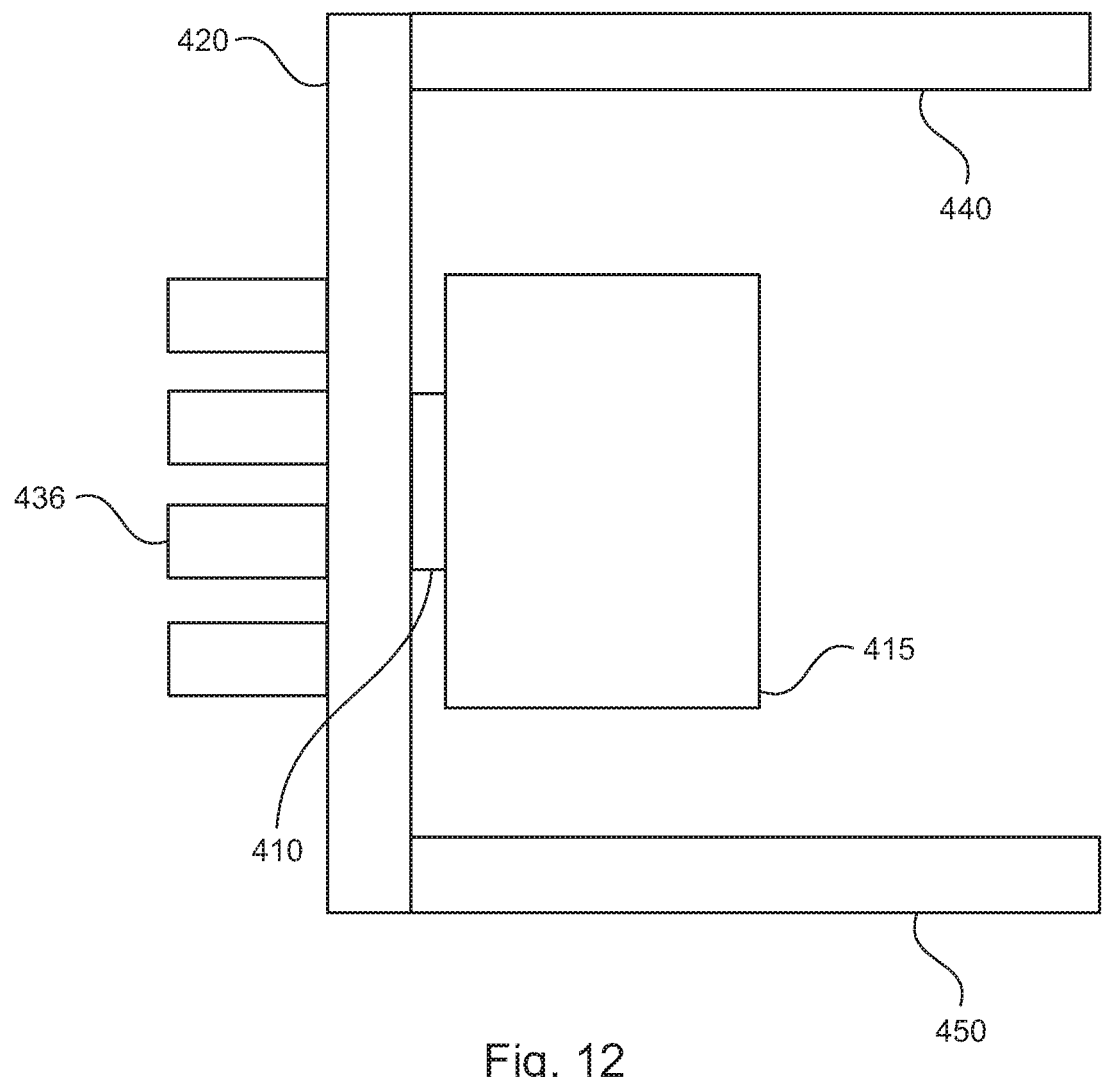
FIG. 12 illustrates another schematic representation of the embodiment depicted in FIG. 11.

FIGS. 7-9 illustrate a conventional switch architecture. Specifically, ports 335, which can also be referred to as outside ports 331, are provided on or at a front face 330 of a box 300 and are formed by connectors that are mounted on a circuit board 320 that provides a connection to chip package 315 that includes a chip 310 that performs the switching tasks. In operation air is typically directed by fan system 340 between the front face 330 and a rear face 334 (past the side walls 332). Such a design allows for air to pass over a heat sink 312 that is mounted on the chip 310 (thus addressing thermal issues) but creates long trace paths for the outside ports because of the physical distance between the chip and the outside ports. As is known, circuit boards are suboptimal for routing high frequency signals over significant lengths and the depicted design degrades the signal integrity of the system for traces extending longer distances. Consequentially, the performance of the outside ports limits the performance of the entire assembly.

FIGS. 10-14 illustrate an alternative embodiment that allows for improved performance while maintaining the use of low cost circuit board materials. Specifically, the use of smaller next gen connectors allows ports 435 with connectors 436 to be grouped on just a part of a front face 430 of a box 400. The smaller connectors 436 can be vertically mounted on a circuit board 420 with a mating side 420a and a chip side 420b and the circuit board 420 is arranged so that it is substantially parallel to the front face 430. In such a configuration the circuit board 420 is directly blocking airflow from front to back. Due to the size of the connectors 436, however, it is possible to group the ports 435 and still provide an air inlet 407 on one side of the box 400 that is sized large enough and is aligned with an aperture 421 in the circuit board 420. The air inlet 407 allows air to flow to an airflow manifold 408 that in turn directs air through an air path 409 over a thermal module 415 (e.g., a heat sink) that is used to help cool a switching chip 410. As can be appreciated, the air path 409 provides a change of direction for air being directed in the air inlet 407 and in an embodiment the change of direction is approximately 90 degrees. A control plane 440 and a power plane 450 (both of which can be provided as small circuit boards) can be positioned on one side of the circuit board so that air passing over the thermal module 415 can also cool any components on the respective boards that could use cooling. In an embodiment, one of power plane 450 and the control plane 440 can be positioned above the thermal module 415 and the other of the power plane 450 and the control plane 440 can be positioned below the thermal module 415 when viewed from a side 400a of the box 400 (as can be appreciated from FIG. 12).

Figure 13:
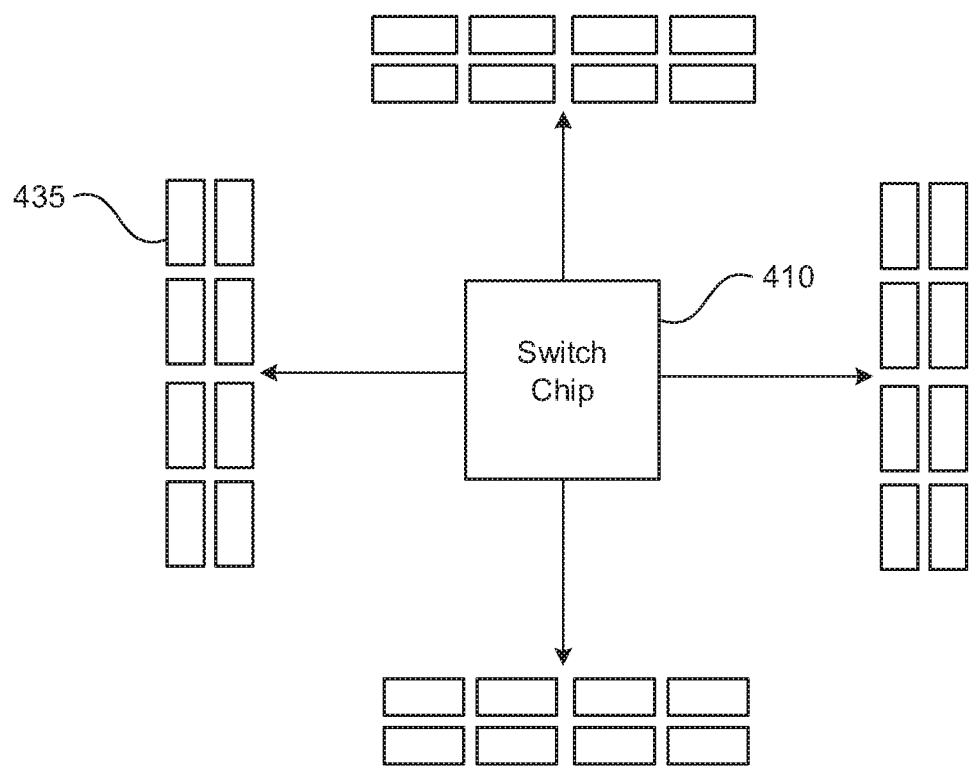
FIG. 13 illustrates a schematic representation of connectors mounted on a circuit board adjacent a switch chip.
Figure 14:
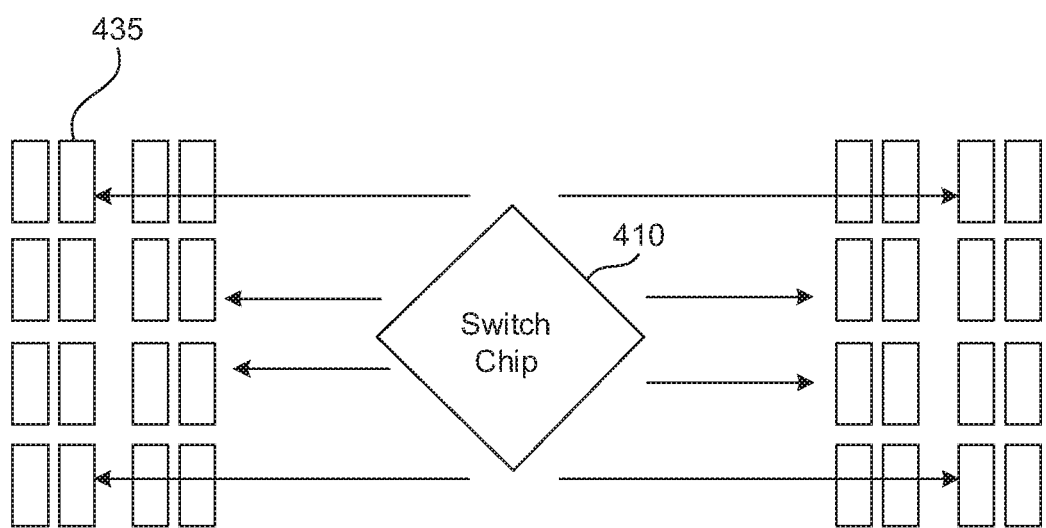
FIG. 14 illustrates another schematic representation of connectors mounted on a circuit board adjacent a switch chip.
Figure 15:
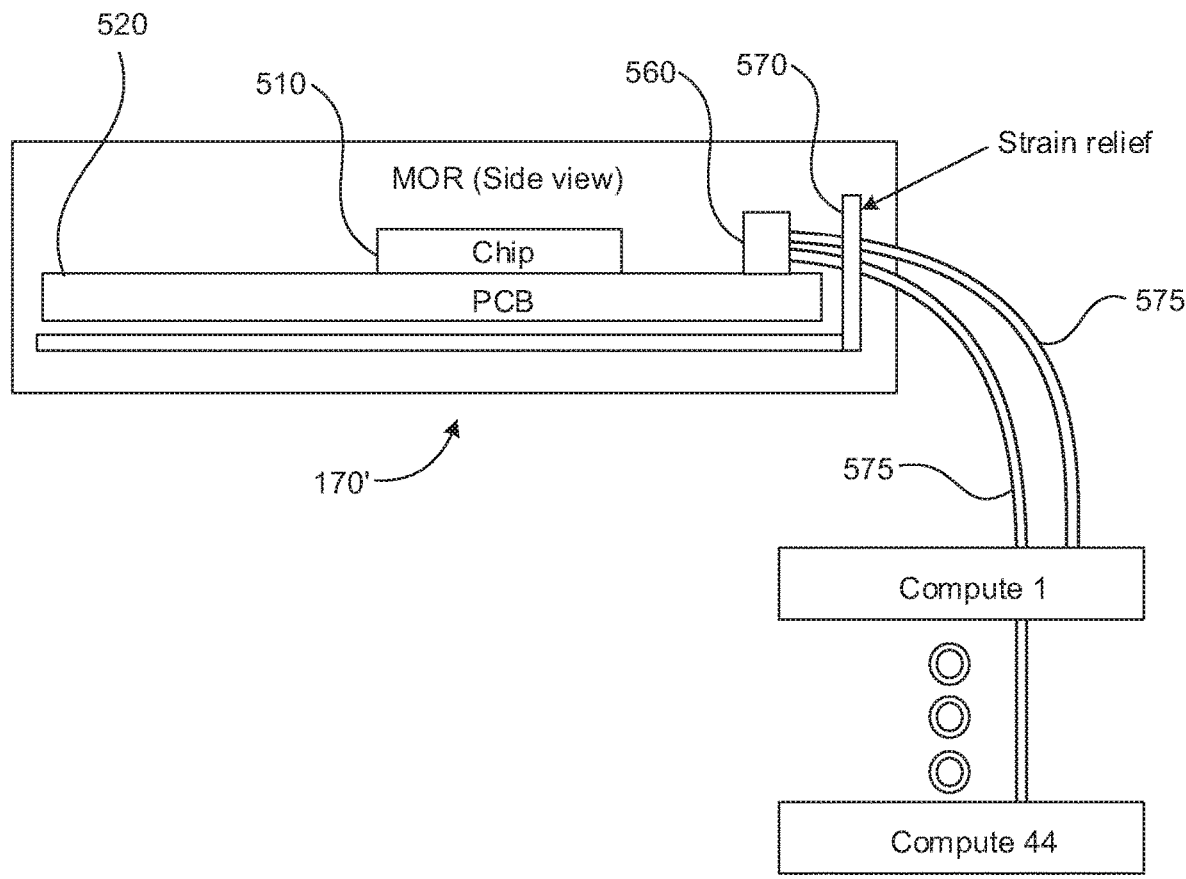
FIG. 15 illustrates a schematic representation of an embodiment of a MOR switch with reduced insertion loss.

Because of the size and orientation of the ports 435 on the front face of the box it is possible to position the switch chip 410 more equidistant to each of the ports 435 and possible arrangement are depicted in FIGS. 13-14. Depending on the configuration the ports 435, the switch chip 410 can be positioned so that ports are positioned on two sides of the switch chip 410 or possibly up to four sides (as depicted in FIG. 13). The total distance can be reduced from 20 cm (or more) to about 10 cm (or less). As a result, the depicted design has the potential to make board materials that would otherwise be unsuitable (because of loss associated with traces extending more than 10 cm between the switch chip and the corresponding connector of the prior art designs) become more suitable for high data rates.

FIGS. 15-17B illustrate features that can be used in an embodiment of a switch system (which could be a MOR switch or a TOR switch) that addresses the problem with circuit board loss in another fashion. A switch 170' includes a circuit board 520 (that can be formed of any desired and suitable material) that supports a chip 510 that is configured to transmit and receive signals. A connector 560 is located adjacent the chip 510. Cables 575 extend from a front face 530 and the cables terminate in connectors 580 (which can be any desired configuration). As can be appreciated, therefore, rather than attempt to move the chip closer to the port the connectors 560 are located adjacent the chip 510 and the connectors 560 are directly connected to a cable assembly. In such an embodiment it is possible to have a first transition from the circuit board 520 (or substrate if the connectors 560 are mounted directly to the substrate for further improvements in performance) to a cable (either directly or via the use of to the terminals in a connector that is non-releasably mounted on the circuit board). The cable 575 extends out the front face 530 of the switch 170' and allow for connections directly to compute nodes via connectors 580.

As can be appreciated, such a configuration avoids at least two transitions between the chip 510 and the cable 575 that plugs into the front of the box. Each transition inherently introduces some insertion loss and thus the depicted design allows for reduced loss between the chip 510 and the connector 580 on the end of the cable 575 compared to convention design. Such an embodiment can thus significantly reduce overall system loss.

One issue with such a construction, however, is that there would is a need to ensure the cables 575 had proper strain relief protection (or any force applied to the cable would be applied to the connector 560, potentially damaging the system). The cables 575 can be protected from excessive translation past the front face by having a strain relief block 570 prevent translation of the cables beyond a front face 530 of the box. The depicted embodiment thus allows a transition between a chip 510 (which may be a chip package) and a board 520 (which may be a substrate), between a board 520 and a terminal in connector 560, between the terminal in connector 560 and a conductor in cable 575 and between conductor in cable 575 and a terminal in connector 580, significantly reducing the number of transitions. Naturally, the connector 560 could also be configured to mount to a board-mounted connector that was positioned adjacent the chip 510 with only a slight increase in loss but with a significant improvement in flexibility.

Figure 17A:
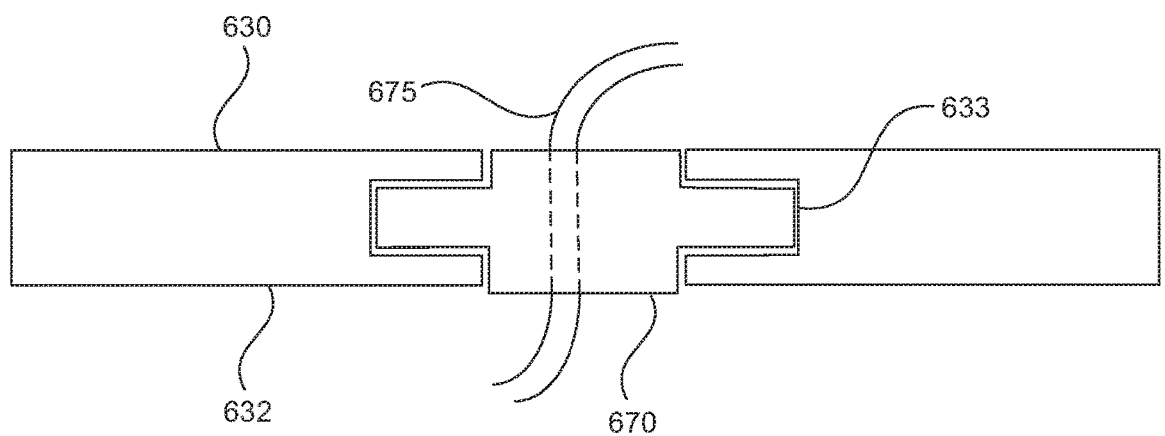
FIG. 17A illustrates a schematic representation of an embodiment of a strain relief block configuration.
Figure 17B:
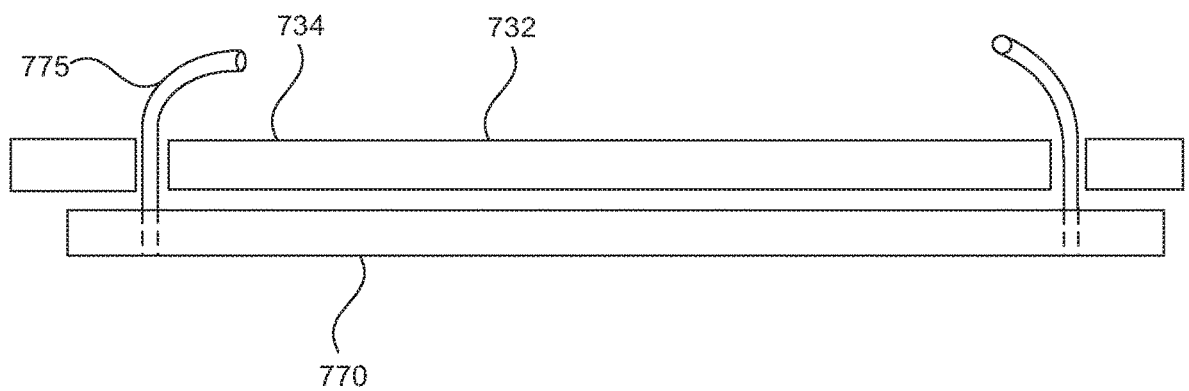
FIG. 17B illustrates a schematic representation of another embodiment of a strain relief block configuration.

The strain relief block 570 can have a variety of configurations. For example, an embodiment is depicted in FIG. 17A where a strain relief block 670 is molded on the cable(s) 675 and the strain relief block 670 is inserted into a slot 633 in a front member 632 (which can provide the front face 630 of the corresponding box or which could be positioned internally to the front face) and is retained in the slot 633. Retention can be provided by configuring the slot 633 so that the strain relief block 670 can only be inserted from one direction and then a cover can be provided to prevent the strain relief block from exiting from the slot 633. As can be appreciated, such a design allows for a particular cable (or set of cables if multiple cables share the same strain relief block) to be removed so that the switch is still repairable while providing a higher level of performance.

In another embodiment a plurality of cables 775 can be molded into a strain relief block 770 that is configured to rest behind the front member 732. In such an embodiment slots 734 in the front member 732 would allow the cables 775 to extend through the front member 732. Naturally a single cable could also be molded into a separate strain relief block 770 so that each cable was molded into a separate block. The main requirement is that the corresponding block is large enough and securely enough fastened to the cable to ensure forces exerted on a distal end of the cable are effectively transferred to the strain relief block 770. In the embodiment provided in both FIGS. 17A and 17B the strain relief block that provides the strain relief could be formed of a conductive plastic or could be plated to help provide suitable EMI protection.

It should be noted that alternative embodiments of a strain relief could be configured to cause two elements to clamp onto the cable. For example, in another embodiment (not shown) two opposing sides of the box could press together and trap one or more wires. Thus, a wide range of possible constructions for strain relief are possible and contemplated.

Figure 18:
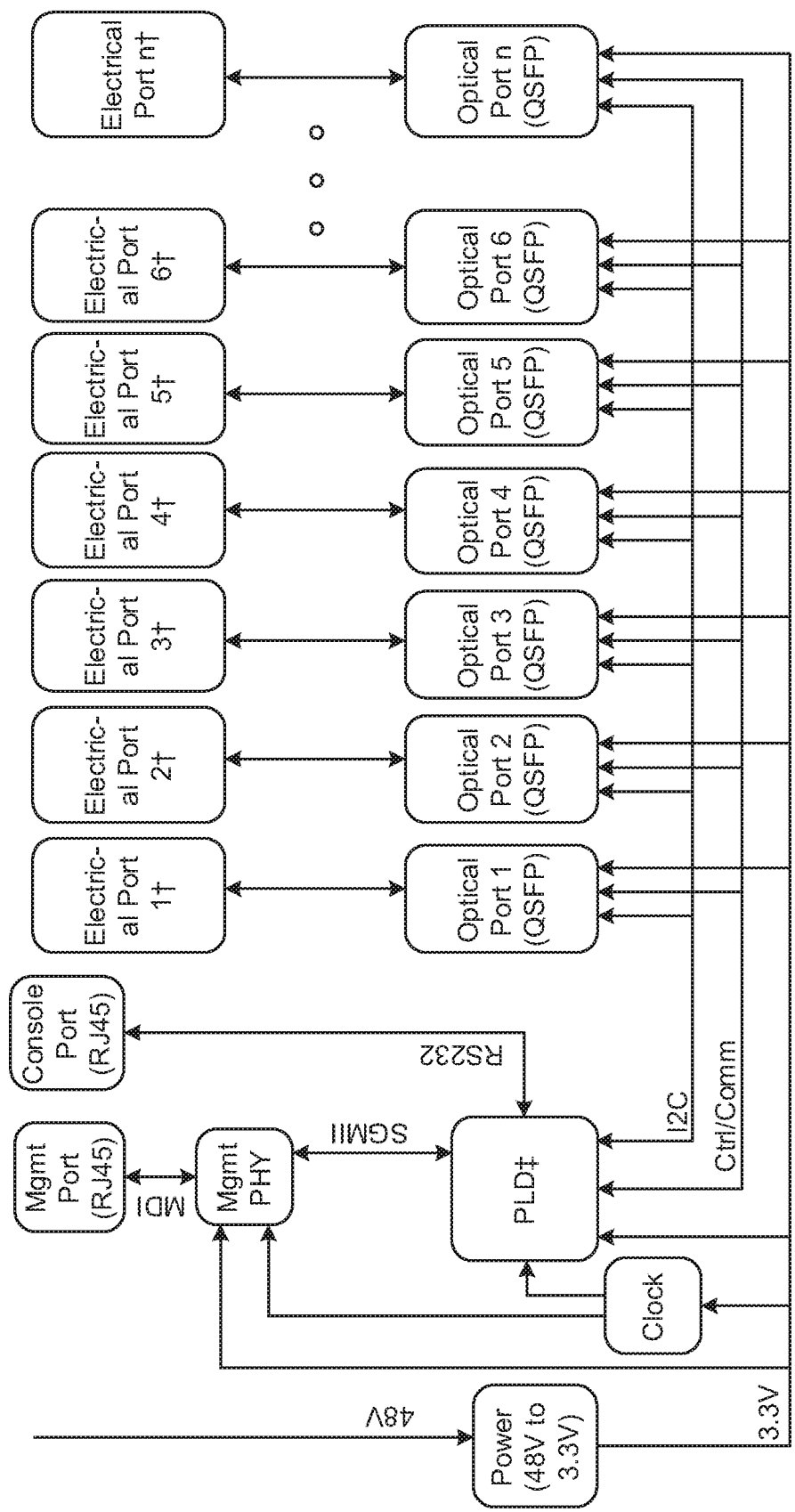
FIG. 18 illustrates a schematic representation of an embodiment of an EOP.
Figure 19:
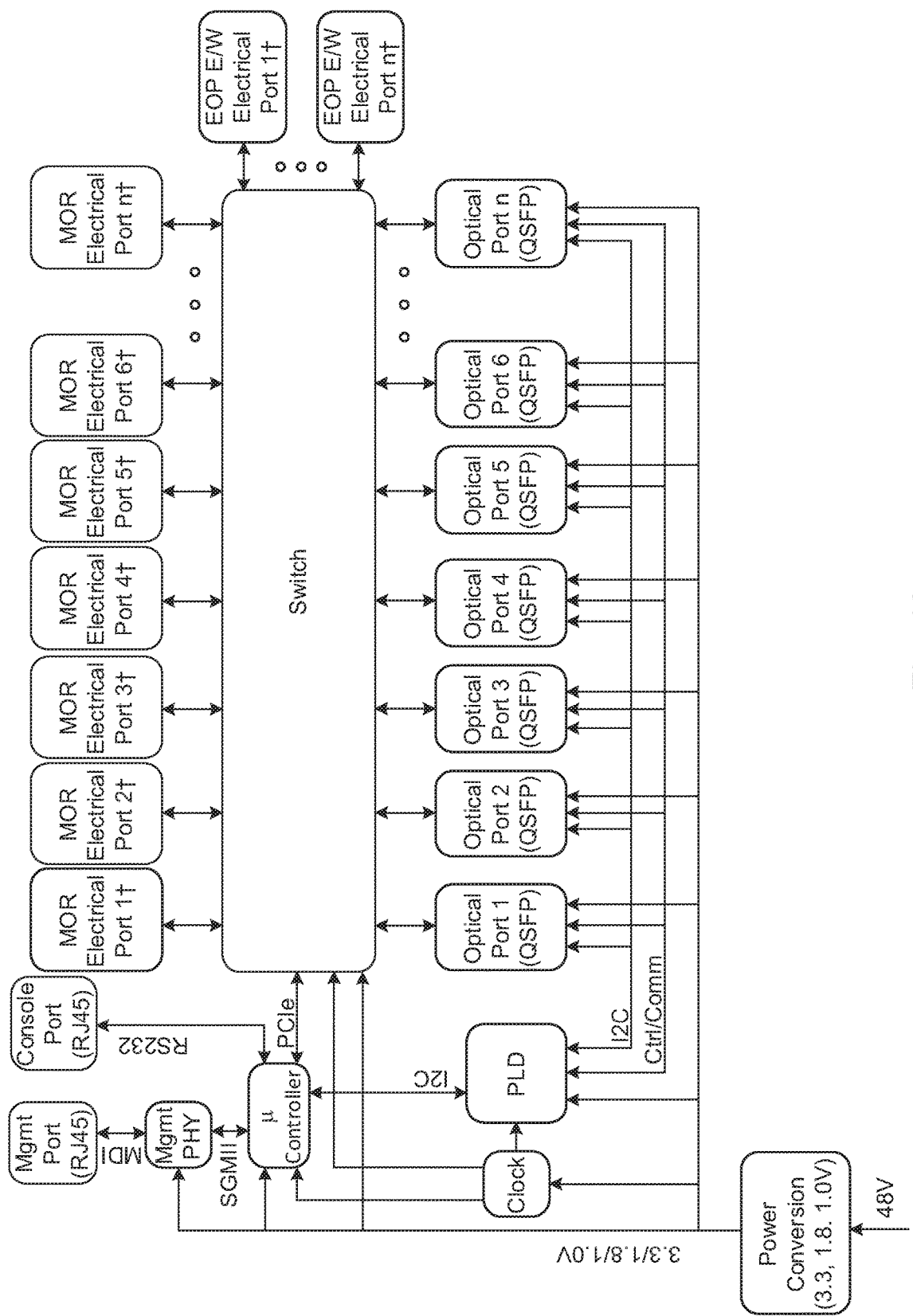
FIG. 19 illustrates a schematic representation of an embodiment of an EOP with a switch.

FIGS. 18-19 illustrate schematic representations of embodiments of EOPs. In FIG. 18 each electrical port is connected directly to a port that is configured to receive an electrical/optical transceiver. It should be noted that while QSFP style connectors are illustrated (and are relatively popular) any suitable form factor could be provided. It should also be noted that if the optical cable assembly is a standard optical connector then the optical port can be a standard optical connector port, such as but without limitation, a LC/PC connector and the switch in FIG. 18 can include an optical to electrical transceiver (or set of transceivers) configured to couple each optical connector to a corresponding electrical port.

Figure 23:
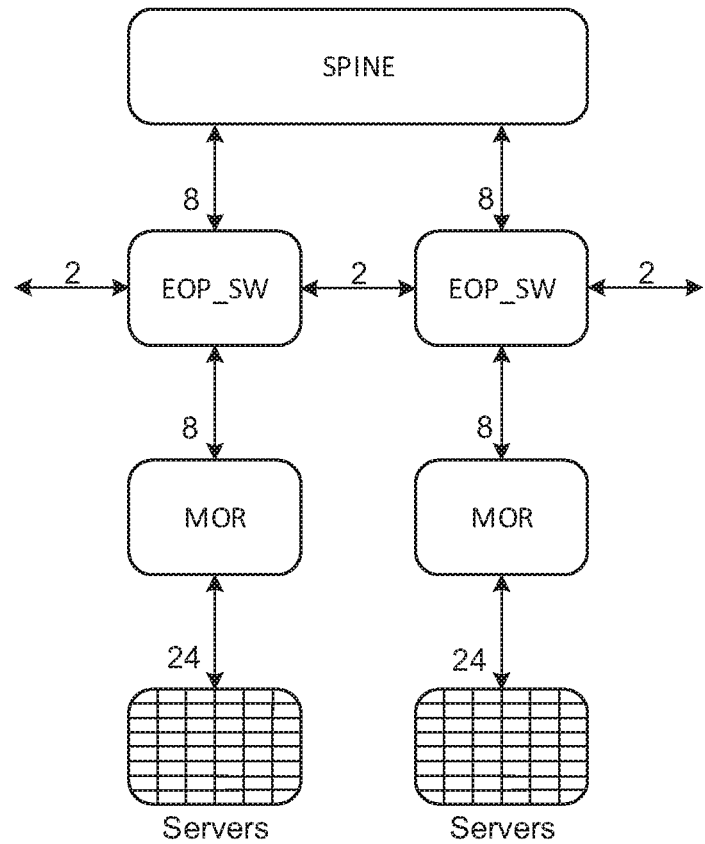
FIG. 23 illustrates a schematic representation of another embodiment of two adjacent server racks.

As can be appreciated, the primary difference between the embodiment in FIG. 18 and FIG. 19 is that the embodiment in FIG. 19 includes a switch, which allows for functionality such as is depicted in FIG. 23. In addition, several EOP east/west (E/W) ports can be provided to allow communication between two EOPs. It is expected that the EOP E/W ports will be electrical and need not be powered as most server racks are located relatively close to other server racks and thus a short connecting cable would be sufficient. In the event that it makes sense for a particular workload to have a connection between two EOPs that are somewhat farther apart then the EOP E/W connectors can be configured to provide powered ports for an electrical/optical transceiver module (or even as pure optical connectors such as the LC/PC connector with internal electrical to optical signal converters).

Figure 20:
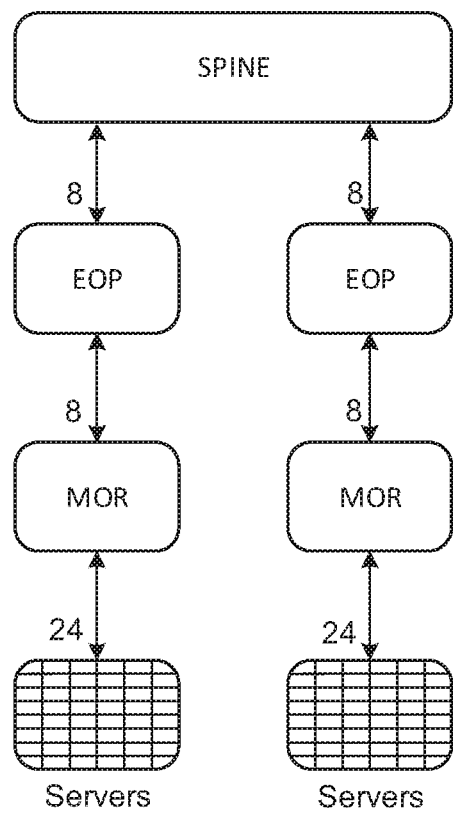
FIG. 20 illustrates a schematic representation of an embodiment of two adjacent server racks.
Figure 21:
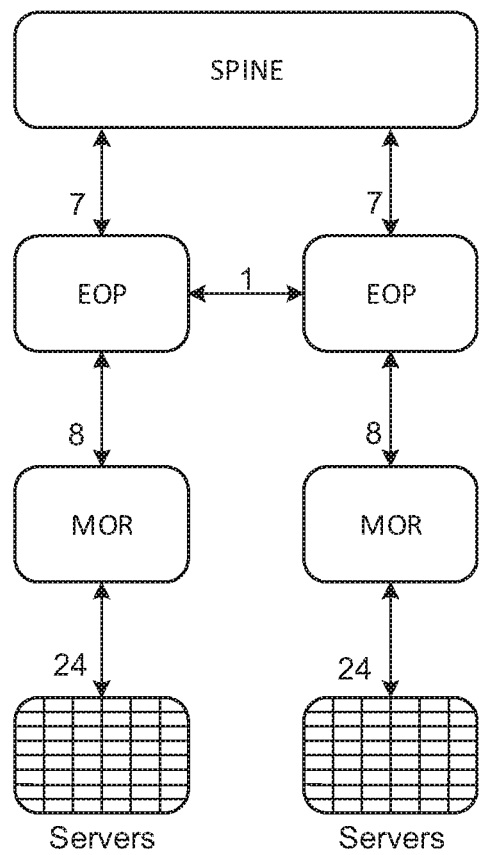
FIG. 21 illustrates a schematic representation of an embodiment of two adjacent server racks.
Figure 22:
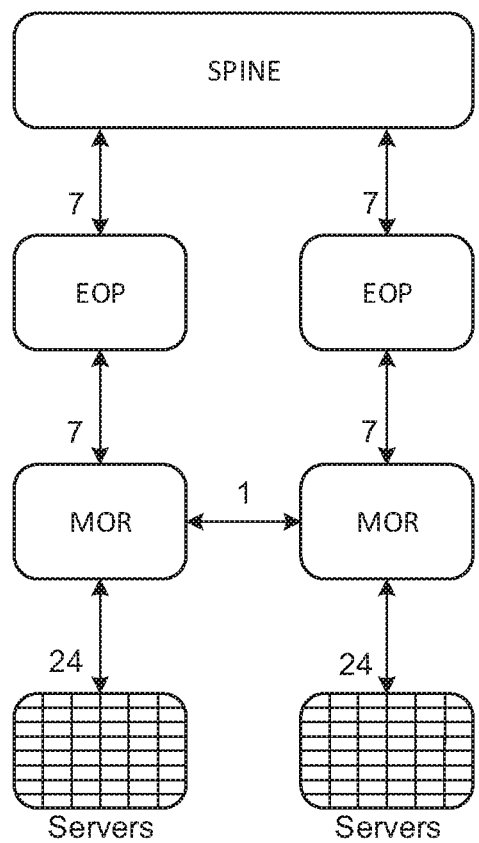
FIG. 22 illustrates a schematic representation of another embodiment of two adjacent server racks.

One issue that can be appreciated from FIG. 20 is that to have lateral communication (e.g., communication between two adjacent server racks) takes 6 hops, where a hop is a transition between two mediums (such as optical signals to electrical signals) and/or passing through a chip (such as a switch chip). In situations where there is a desire to communicate laterally between servers in adjacent racks this construction creates significant latency delays. FIGS. 21-23 illustrate ways to address this issue. FIG. 21 takes one of the links to the spine and instead routes it to the adjacent EOP. This allows for the reduction of one hop (albeit at the cost of increasing the over subscription to a 3.4:1 ratio. FIG. 22 illustrates an embodiment where the oversubscription is still 3.4:1 but there are only three hops between compute nodes in adjacent racks. As can be appreciated, such a construction allows for reduced latency between adjacent servers and may be desirable in situations where computing tasks benefit from high levels of parallel processing or for situations where both racks are working on a computing project and it is not possible to fit all the tasks one server rack.

FIG. 23 offers additional flexibility but does increase complexity of the EOP. By incorporating a switch in the EOP the number of hops between adjacent servers can be kept at 6 while still maintaining the desired 3:1 oversubscription ratio. One potential significant benefit of the embodiment in FIG. 23 is that it allows for more flexible routing of signals. For example, if one server rack has a large amount of responses to provide it can possible direct some of the responses to an adjacent EOP, potentially bringing the oversubscription ratio (at least for a short period of time) down to 2:1. Naturally such an architecture is most beneficial for systems where there is sufficient flexibility programmed into the EOP/MOR and/or the workload benefits from such.

Figure 24:
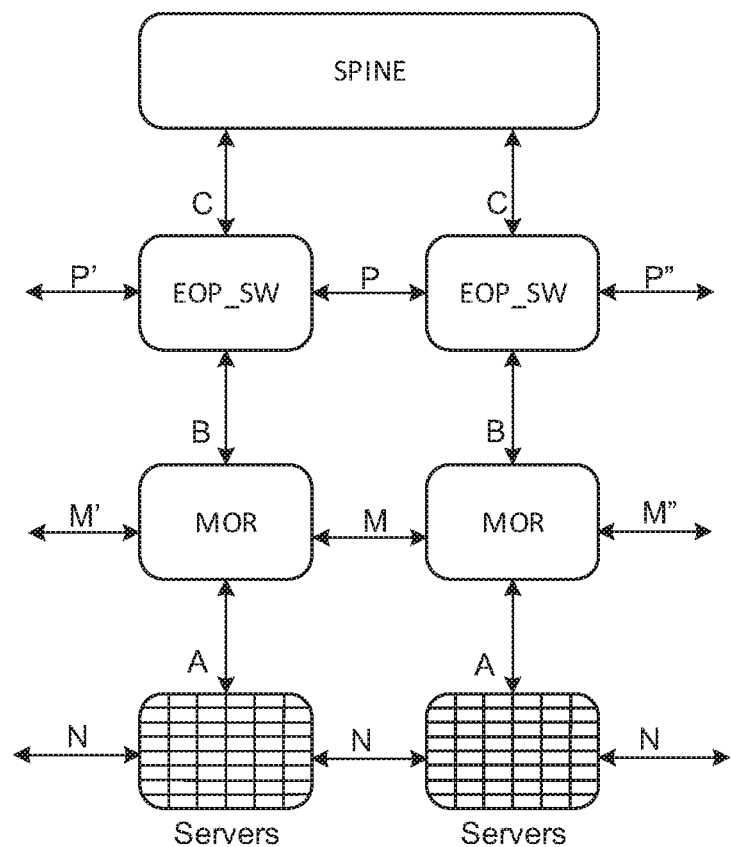
FIG. 24 illustrates a schematic representation of another embodiment of two adjacent server racks.

FIG. 24 illustrates a further embodiment with additional flexibility that can be provided. As can be appreciated, the number of connections between the servers and MOR switch are still equivalent to the number of compute nodes (because it is desirable for each compute node to communication with the MOR directly) but adjacent MOR switches can also communicate with each other. In addition, adjacent EOPs can communicate with each other. It is expected that in most cases either the M links or the P links will be used (as often both would not be needed) but both can be used if maximum connectivity and flexibility is desired.

In addition, the compute nodes of two adjacent server racks can directly communicate with each other, using a single hop and the number of connections N, M, B, P and C can be varied so that a variety of scenarios can take place. As can be appreciated, such a system has significant benefits in flexibility. By connecting the servers directly together additional computation power can be used to address a task with only minimal latency (one hop). Thus the result is a flexible configuration where computation nodes can be combined and then the information can be transmitted back to the spine through a combination of paths to ensure maximum use of the available bandwidth.

In one embodiment 2N can equal A such that each of the compute nodes in one server rack can essentially have their performance doubled by linking in a compute node in an adjacent server that is one hop away (assuming a server rack is surrounded on two sides by similar server racks). As the number of A links is typically greater than the number of B links (often a 3:1 ratio), the depicted configuration allows for information to be spread from MOR switch to adjacent MOR switch via M links (which could be as many links as there are B links but more likely will be some smaller amount given the space constraints expected on the MOR switch). If the number of M and P links are kept lower to facilitate available space in the MOR switch and/or EOP then a combination of M links and P links can be used to essentially provide a 1:1 ratio (and thus there would be no over subscription). It should be noted, however, that such a configuration does add one or more hops to the path between a compute node and the spine when additional bandwidth is being added and thus the desirability of such adding the additional bandwidth will depend on the application's sensitivity to latency between the client (which can be external to the spine) and the compute node versus the need for additional performance at the compute node.

The disclosure provided herein describes features in terms of preferred and exemplary embodiments thereof. Numerous other embodiments, modifications and variations within the scope and spirit of the appended claims will occur to persons of ordinary skill in the art.

We claim:

1. A system, comprising:
 a server rack having a top and a bottom and a plurality of compute nodes arranged vertically, the plurality of compute nodes spaced apart between the top and bottom, the server rack further including a middle of the rack (MOR) switch positioned approximately halfway between the top and bottom, the MOR switch including a first set of ports and a second set of ports, the first and second set of ports configured to transmit signals electrically;
 a plurality of first passive cables extends between the first set of ports and the plurality of compute nodes, wherein each of the plurality of compute nodes is connected to the MOR switch via at least one of the first passive cables and the plurality of first passive cables are configured to support 56 Gbps data rate using non-return to zero (NRZ) encoding;
 an electrical to optical panel (EOP) positioned on an upper portion of the rack server, the EOP configured with a plurality of passive ports; and
 a plurality of second passive cables extending between the plurality of passive ports and the second set of ports.

2. The system of claim 1, wherein the EOP includes a plurality of active ports, each of the active ports configured to provide power and high speed electrical signals.

3. The system of claim 2, wherein each one of the plurality of passive ports is connected to one of the plurality of active ports.

4. The system of claim 2, wherein each of the plurality of passive ports are connected to a switch positioned in the EOP and each of the plurality of active ports are connected to the switch, the switch configured to direct signals between the active ports and the passive ports.

5. The system of claim 1, wherein the EOP includes a plurality of optical ports, the plurality of optical ports being connected to the plurality of passive ports, wherein the optical ports each include an optoelectrical transceiver configured to convert optical signals to electrical signals and to further convert electrical signals to optical signals.

6. The system of claim 5, wherein the optical ports are Lucent Connector/Physical Contact (LC/PC) connections.

7. The system of claim 1, wherein each of the passive cables of the plurality of passive cables are not more than about 1.5 meters long.

* * * * *